United States Patent
Arora et al.

(10) Patent No.: US 10,447,266 B2
(45) Date of Patent: Oct. 15, 2019

(54) LOW POWER ENERGY DETECTOR

(71) Applicant: TEXAS INSTRUMENTS INCORPORATED, Dallas, TX (US)

(72) Inventors: Anurag Arora, Bengaluru (IN); Hariharan Nagarajan, Chittur (IN); Sumantra Seth, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/849,752

(22) Filed: Dec. 21, 2017

(65) Prior Publication Data

US 2018/0309447 A1 Oct. 25, 2018

(30) Foreign Application Priority Data

Apr. 24, 2017 (IN) .............................. 201741014411

(51) Int. Cl.
*H03K 19/00* (2006.01)
*H04L 12/12* (2006.01)
*H04L 12/40* (2006.01)

(52) U.S. Cl.
CPC .......... *H03K 19/0016* (2013.01); *H04L 12/12* (2013.01); *H04L 12/40006* (2013.01)

(58) Field of Classification Search
CPC ............................ H03K 19/0016; H04L 12/12
USPC ...................................................... 327/198
See application file for complete search history.

(56) References Cited

U.S. PATENT DOCUMENTS

| | | | | |
|---|---|---|---|---|
| 7,149,243 B2* | 12/2006 | Porat | ...................... | H04L 12/12 375/222 |
| 8,620,394 B2* | 12/2013 | Sebastiano | ........ | H04W 52/0229 455/574 |
| 8,812,878 B2* | 8/2014 | Tan | ...................... | G06F 1/3206 713/300 |
| 9,454,212 B1* | 9/2016 | Schulze | .................. | G06F 1/324 |
| 9,477,292 B1* | 10/2016 | Murali | .................. | G06F 1/3243 |
| 2009/0275302 A1* | 11/2009 | Huston | ..................... | H04B 1/24 455/231 |
| 2011/0261907 A1* | 10/2011 | Lee | ................... | H04W 52/0229 375/340 |
| 2013/0095780 A1* | 4/2013 | Prazan | ................ | H04B 1/1615 455/234.1 |

FOREIGN PATENT DOCUMENTS

EP 0676727 A2 * 10/1995 ......... G06K 19/0723

* cited by examiner

*Primary Examiner* — William Hernandez
(74) *Attorney, Agent, or Firm* — Andrew Viger; Charles A. Brill; Frank D. Cimino

(57) ABSTRACT

A wakeup circuit includes an amplification stage circuit and a filter stage circuit. The amplification stage circuit is configured to, in response to receiving an input signal, generate an amplified digital signal that is proportional to the input signal. The filter stage circuit is configured to, in response to receiving a threshold number of toggles of the amplified digital signal within a pre-defined time period (such as one clock period of a clock signal), generate a wakeup signal as an output signal of the filter stage circuit.

20 Claims, 4 Drawing Sheets

LOW POWER ENERGY DETECTOR

CROSS-REFERENCE TO RELATED APPLICATIONS

The present application claims priority to Indian Provisional Patent Application No. 201741014411, filed Apr. 24, 2017, titled "Ultra-Low Power Energy Detector," which is hereby incorporated herein by reference in its entirety.

BACKGROUND

It is advantageous for electrical systems to be power efficient. Therefore, reducing power consumption in the system is desirable. One way to reduce power consumption in an electrical circuit is to have a low power mode (e.g., a sleep mode) that a circuit may operate under while the circuit is not performing tasks. Once the circuit is needed by the system, a wakeup signal is generated to power up the circuit so that it may operate as intended. For example, in battery operated cars, it is preferable that the automotive Ethernet be power efficient to reduce energy use by the battery. Therefore, the Ethernet physical layer (PHY) can be placed in a low power sleep mode when it is not transmitting or receiving data. The Ethernet PHY is powered up once there is data toggling on the line. A detection circuit can be utilized to determine whether data is toggling on the line. Once the data is detected, a wakeup circuit can generate a wakeup signal causing the Ethernet PHY to power up (wakeup). In this way battery power is conserved.

SUMMARY

In accordance with at least one example of the disclosure, a wakeup circuit includes an amplification stage circuit and a filter stage circuit. The amplification stage circuit is configured to, in response to receiving an input signal, generate an amplified digital signal that is proportional to the input signal. The filter stage circuit is configured to, in response to receiving a threshold number of toggles of the amplified digital signal within a pre-defined time period (such as one clock period of a clock signal), generate a wakeup signal as an output signal of the filter stage circuit.

Another illustrative example is a low power mode circuit system that includes a master circuit and a slave circuit. The master circuit is configured to generate an input signal. The slave circuit includes a wakeup circuit and a main circuit. The wakeup circuit is configured to receive the input signal, in response to receiving the input signal, generate an amplified digital signal that is proportional to the input signal, and, in response to receiving a threshold number of toggles of the amplified digital signal within a pre-defined time period (such as one clock period of a clock signal), generate a wakeup signal. The main circuit is configured to, in response to receiving the wakeup signal, power up from a low power mode to a regular operation mode.

Yet another illustrative example is a method for generating a wakeup signal. The method includes receiving an input signal indicating that a circuit is to exit a low power mode from a master circuit. The method also includes, in response to receiving the input signal, generating an amplified digital signal that is proportional to the input signal. The method also includes, in response to receiving a threshold number of toggles of the amplified digital signal within a pre-defined time period (such as one clock period of a clock signal), generating, by a digital filter, the wakeup signal.

BRIEF DESCRIPTION OF THE DRAWINGS

For a detailed description of various examples, reference will now be made to the accompanying drawings in which.

NOTATION AND NOMENCLATURE

Figure 1:
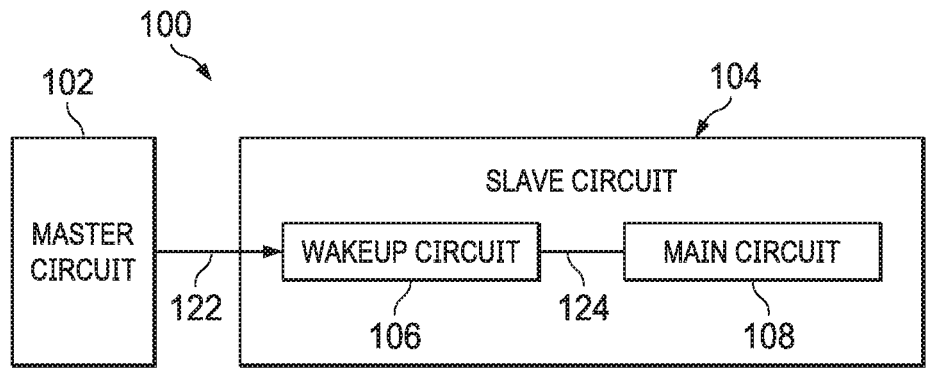
FIG. 1 shows an illustrative block diagram of a low power mode circuit system in accordance with various examples.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various examples of the disclosure. Although one or more of these examples may be preferred, the examples disclosed should not be interpreted, or otherwise used, as limiting the scope of the disclosure, including the claims. In addition, one skilled in the art will understand that the following description has broad application, and the discussion of any example is meant only to be exemplary of that example, and not intended to intimate that the scope of the disclosure, including the claims, is limited to that example.

One way to reduce power consumption in an electrical system is to have a low power mode (e.g., a sleep mode) that a circuit in the system may operate under while the circuit is not performing tasks. Once the circuit is needed by the system, a wakeup signal is generated to power up the circuit so that it may operate as intended. For example, in battery operated cars, it is preferable that the automotive Ethernet be power efficient to reduce energy use by the battery. Therefore, the Ethernet physical layer (PHY) can be placed in a low power sleep mode when it is not transmitting or receiving data. The Ethernet PHY is powered up once there is data toggling on the line. A detection circuit can be utilized to determine whether data is toggling on the line. Once the data is detected, a wakeup circuit can generate a wakeup signal causing the Ethernet PHY to power up (wakeup). In this way battery power is conserved. Thus, a signal detection circuit is responsible for detecting a signal being sent from a remote circuit (e.g., a remote PHY), reject false triggers, and wakeup the sleeping circuit (e.g., the Ethernet PHY) once a valid signal is detected.

In one conventional system, an envelope detector, comparator, and filter are utilized as a signal detection circuit. The incoming signal is received by the envelope detector which outputs an envelope of the incoming signal. The output of the envelope detector is compared with a locally generated reference voltage. The comparator output is filtered to ensure only valid signals are detected (e.g., to filter out false triggers due to noise present in the cable). This filtered signal is the signal detect output. In other words, the signal detect output indicates to a wakeup circuit that the sleeping circuit (e.g., Ethernet PHY) is to be powered up. However, these conventional signal detection circuits are generally energy inefficient (e.g., power hungry). For example, as discussed above, conventional signal detection circuits typically require comparators and rectifiers which are always powered, so that the incoming signal is detected. These comparators and rectifiers cannot be realistically implemented on a power budget of 10 µA in 65 nm technology. Furthermore, such conventional systems are typically area inefficient. Therefore, there is a need for a signal detection circuit that can detect the presence of a signal from a remote circuit (e.g., a data signal from a remote PHY) with a relatively low power consumption (e.g., 10 µA) while the main circuit (e.g., the Ethernet PHY) is in a low power mode.

In accordance with various examples, a wakeup circuit is provided that includes an amplification stage circuit and a filter stage circuit. The amplification stage circuit receives a signal sent from a remote circuit (e.g., a remote PHY) and amplifies the signal with a large enough amplitude to be considered a toggling signal. In some examples, the amplification stage circuit includes a first inverter biased for operation as a linear amplifier to amplify the incoming signal and a second inverter to generate a digital version of the amplified signal. The digital signal is filtered by the filter stage circuit to ensure valid signals are detected (e.g., to filter out false triggers due to noise present in the cable). This filtered signal is the signal detect output. In other words, the signal detect output indicates to the sleeping circuit (e.g., Ethernet PHY) is to be powered up. Because a single stage gain path (inverter based architecture) is used, such a system consumes a relatively low amount of power (e.g., less than 10 µA) especially when compared to the conventional systems that employ comparators and envelope detectors. Furthermore, such a wakeup circuit is simpler than conventional envelope detector circuits, thus more area efficient. In this way, the disclosed wakeup circuit is able to provide a wakeup signal while reducing power requirements. While some examples discussed herein are directed at Ethernet, other wireline serial communications link systems and/or any other electrical system may include such a wakeup circuit.

FIG. 1 shows an illustrative block diagram of a low power mode circuit system 100 in accordance with various examples. The low power mode circuit system 100 includes, in an example, a master circuit 102 and a slave circuit 104.

The master circuit 102 can be configured to generate and transmit input signal 122, in some examples through a wired connection, to the slave circuit 104. The input signal 122 can include data transmitted from the master circuit to the slave circuit 104. The slave circuit, in an example, is configured to have at least two modes of operation, a low power mode, in which the slave circuit 104 conserves power and an active mode in which the slave circuit 104 performs functions it is designed to perform.

For example, the master circuit 102 can be a master PHY that transmits data as input signal 122 to an Ethernet PHY acting as slave circuit 104. The Ethernet PHY can be configured to remain in a low power mode when it is not transmitting or receiving data. However, when the master PHY transmits data, as input signal 122, to the Ethernet PHY, the Ethernet PHY enters an active mode to receive the data and perform any additional functions associated with the received data (e.g., transmit Ethernet frames).

Therefore, the slave circuit 104 includes, in an example, a wakeup circuit 106 and a main circuit 108. The main circuit 108 is a circuit within the slave circuit 104 that performs the main functions of the slave circuit 104. For example, if the slave circuit 104 is an Ethernet PHY, the main circuit 108 can implement the hardware send and receive function of Ethernet frames. The main circuit 108, as discussed above, when not actively performing functions, can enter a low power mode. Therefore, the main circuit 108 is powered up (i.e., woken up) to perform functions.

The wakeup circuit is configured to receive the input signal 122 and generate an output signal 124. In some examples, when the output signal 124 is HIGH, the output signal 124 acts as a wakeup signal configured to cause the main circuit 108 to power up (i.e., wakeup) from a low power mode. For example, in response to receiving the input signal 122 (e.g., data transmitted by a remote PHY), the wakeup circuit 106 generates a HIGH output signal 124 as a wakeup signal which is provided to the main circuit 108. The wakeup signal causes the main circuit 108 to power up.

Figure 2:
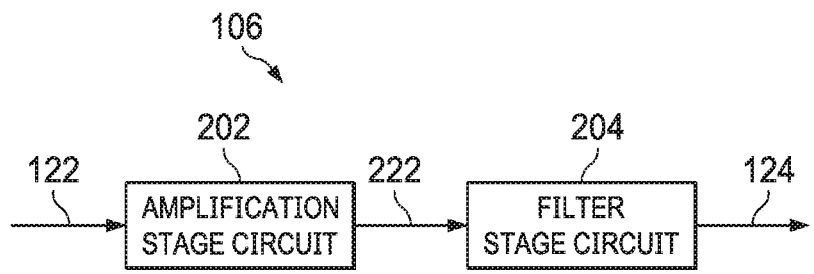
FIG. 2 shows an illustrative block diagram of a wakeup circuit in a low power mode circuit system in accordance with various examples.

FIG. 2 shows an illustrative block diagram of wakeup circuit 106 in slave circuit 104 of low power mode circuit system 100 in accordance with various examples. The wakeup circuit 106 includes, in an example, an amplification stage circuit 202 and a filter stage circuit 204. The amplification stage circuit 202 is configured to receive the input signal 122. In response to receiving the input signal 122, the amplification stage circuit 202 is configured to generate an amplified digital signal 222 that is proportional to the input signal 122. For example, in some examples, the input signal 122 is an analog signal with a relatively low amplitude (e.g., an amplitude that may not wakeup the main circuit 108). Therefore, the amplification stage circuit 202 is configured to amplify the input signal 122 to an amplitude that can wakeup the main circuit 108 and convert the analog signal to a digital signal.

The filter stage circuit 204 is coupled to the amplification stage circuit 202 and is configured to receive the amplified digital signal 222 from the amplification stage circuit 202. The filter stage circuit 204 includes, in an example, an oscillator that generates a clock signal. If the amplified digital signal 222 toggles (i.e., transitions from a LOW signal to a HIGH signal) a threshold number of times (e.g., 3) within one clock period of the clock signal, the filter stage circuit 204 generates a HIGH output signal 124 as a wakeup signal to wakeup (e.g., power up) the main circuit 108.

Figure 3:
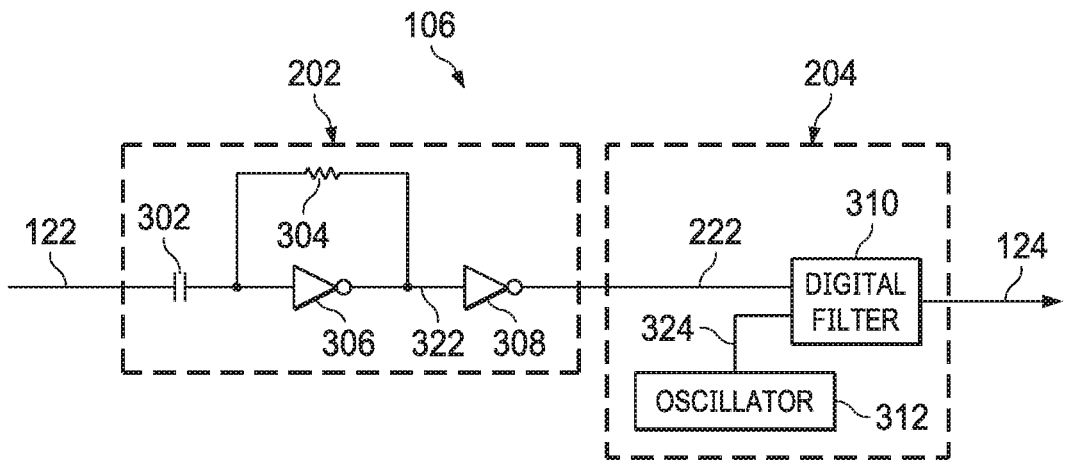
FIG. 3 shows an illustrative circuit diagram for a wakeup circuit in a low power mode circuit system in accordance with various examples.

FIG. 3 shows an illustrative circuit diagram for wakeup circuit 106 in slave circuit 104 of low power mode circuit system 100 in accordance with various examples. As discussed above, the wakeup circuit 106 includes, in an example, an amplification stage circuit 202 and a filter stage circuit 204. The amplification stage circuit 202, in an example, includes a coupling capacitor 302, inverters 306-308, and feedback resistor 304. Because the inverter 306 is provided with feedback through feedback resistor 304, the inverter 306 in parallel with feedback resistor 304 act as a linear amplifier. In other words, the inverter 306 is biased for operation as a linear amplifier. The resulting signal output by the inverter 306 is an amplified analog version of the input signal 122 (shown as amplified analog signal 322).

The coupling capacitor 302, in some examples, is coupled to and in series with the inverter 308. The coupling capacitor 302 is configured, in some examples, to have a capacitance to tune a response of the first inverter to be centered on a frequency of the input signal 122. For example, the coupling capacitor 302 adds a zero to the amplifier response of the linear amplifier comprising the inverter 306 and feedback resistor 304. The amplifier response also includes a pole at the output of this linear amplifier. Therefore, the overall amplifier response can be made bandpass if the coupling capacitor 302 is large enough (e.g., has a capacitance large enough) to keep the output pole at a relatively higher frequency compared to the frequency of the input signal 122. Hence, the amplifier response of the linear amplifier comprising the inverter 306 and feedback resistor 304 can be tuned to be centered on the frequency of the input signal 122. The bandpass nature of the filter provides noise rejection for frequencies other than the frequency of the input signal 122.

The inverter 308 is configured, in an example, to receive amplified analog signal 322 and generate the amplified digital signal 222. While a single inverter 308 is shown, in some examples, the inverter 308 includes more than a single inverter. For example, two inverters in series may comprise inverter 308. In some examples, the inverters 306 and 308 have different switching thresholds. For example, the inverter 308 may have a switching threshold that is greater than the switching threshold of the inverter 306. Because, in some examples, the inverter 308 has relatively high switching threshold, spurious noise is, in many cases, rejected. Thus, due to the bandpass properties of the linear amplifier comprising the inverter 306 and the feedback resistor 304, and the relatively large switching threshold of inverter 308 in some examples, the amplified digital signal 222 can be devoid of all or most noise signals which helps prevent a false wakeup signal being generated as output signal 124.

The filter stage circuit 204, in an example, includes digital filter 310 and oscillator 312. The oscillator 312 is configured to generate the clock signal 324. In some examples, the oscillator 312 is a relatively low-leakage ring oscillator that generates a relatively low frequency clock signal 324. The digital filter 310, which can be either a synchronous or asynchronous filter, is configured, in an example to receive the amplified digital signal 222 and the clock signal 324 and generate the output signal 124. In asynchronous filter implementations, oscillator 312 and clock signal 324 may not be present. If the digital filter 310 detects the threshold number of toggles (transitions from a LOW signal to a HIGH signal) in the amplified digital signal 222 within one clock period of the clock signal 324, the digital filter 310, in an example, sets the output signal 124 HIGH, thus, generating a wakeup signal for the main circuit 108 causing the main circuit 108 to power up from the low power mode and/or to remain in a full power mode. However, if the digital filter 310 receives and thus, detects less than the threshold number of toggles (transitions from a LOW signal to a HIGH signal) in the amplified digital signal 222 within one clock period of the clock signal 324, the digital filter 310, in an example, sets the output signal 124 LOW and/or resets the output signal 124 LOW, thus causing the main circuit 108 to remain in the low power mode and/or to enter the low power mode. In this way, the wakeup circuit 106 is capable of generating a wakeup signal while consuming a relatively low amount of power because the wakeup circuit 106 uses, in an example, a single stage gain path with an inverter based architecture.

Figure 4:
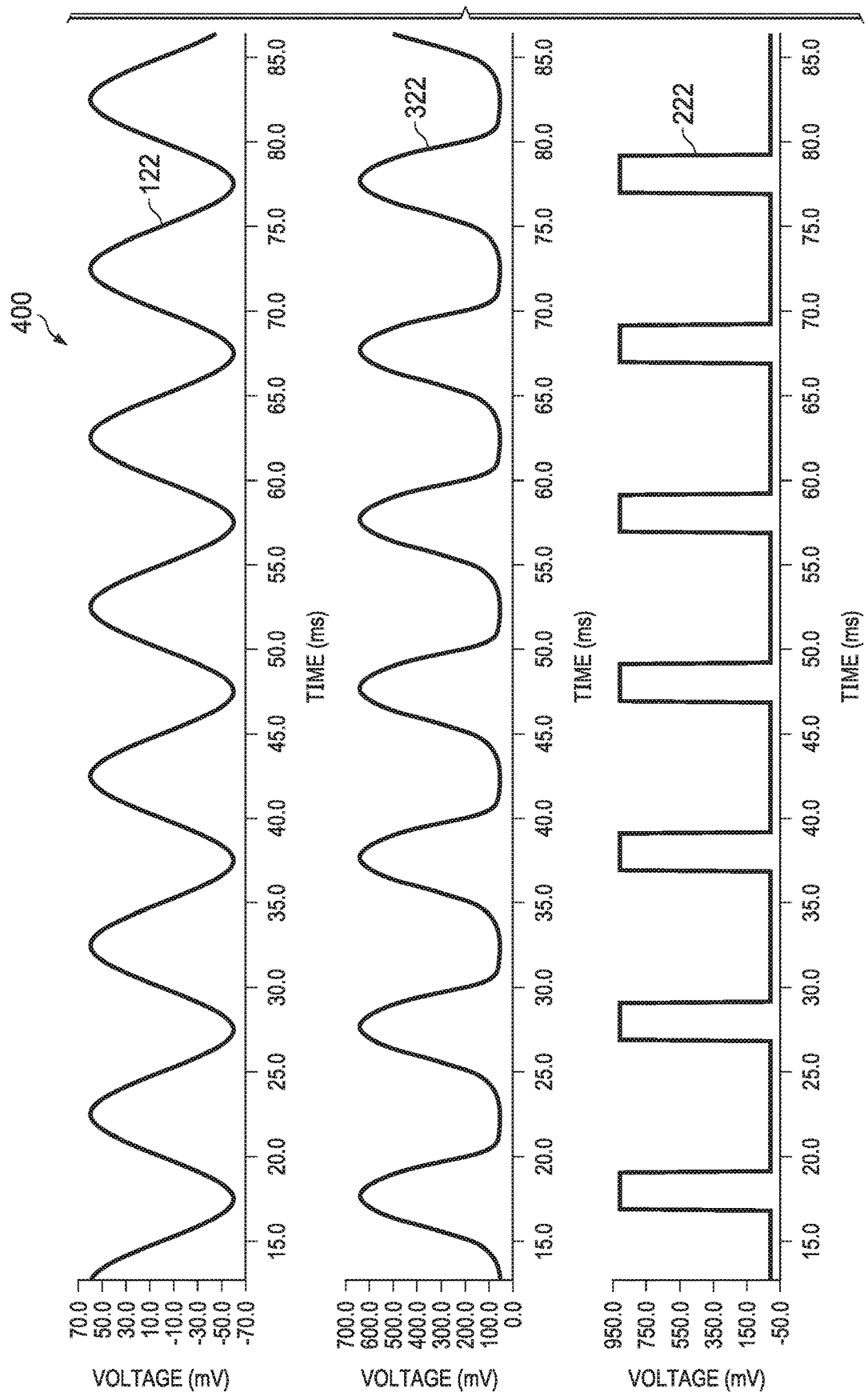
FIG. 4 shows an illustrative voltage versus time graph for an input signal, an amplified analog version of the input signal, and an amplified digital signal in accordance with various examples.

FIG. 4 shows an illustrative voltage versus time graph 400 for input signal 122, amplified analog signal 322, and amplified digital signal 222 in accordance with various examples. As shown in FIG. 4, the example input signal 122 is an analog signal that has an amplitude of 120 mV peak to peak (from −60 mV to 60 mV). As discussed above, the amplifier comprised of the inverter 306 and feedback resistor 304 amplify the input signal 122 to generate the amplified analog signal 322. The example amplified analog signal 322 shown in FIG. 4 has an amplitude of 600 mV peak to peak (from 50 mV to 650 mV). Thus, the amplified analog signal 322 is an amplified version of the input signal 122. The amplified digital signal 222 is a digital signal that toggles (transitions from a LOW signal to a HIGH signal) once the voltage of the amplified analog signal 322 reaches the switching threshold of inverter 308. Thus, in the example shown in FIG. 4, the switching threshold of inverter 308 is approximately 550 mV. Thus, if the amplified digital signal 222 is LOW, once the amplified analog signal 322 rises to equal 550 mV, the inverter 308 generates a HIGH amplified digital signal 222. Similarly, if the amplified digital signal 222 is HIGH, once the amplified analog signal 322 drops to equal 550 mV, the inverter 308 generates a LOW amplified digital signal 222. In this way, the amplified digital signal 222 is generated by the inverter 308 of the amplification stage circuit 202.

Figure 5:
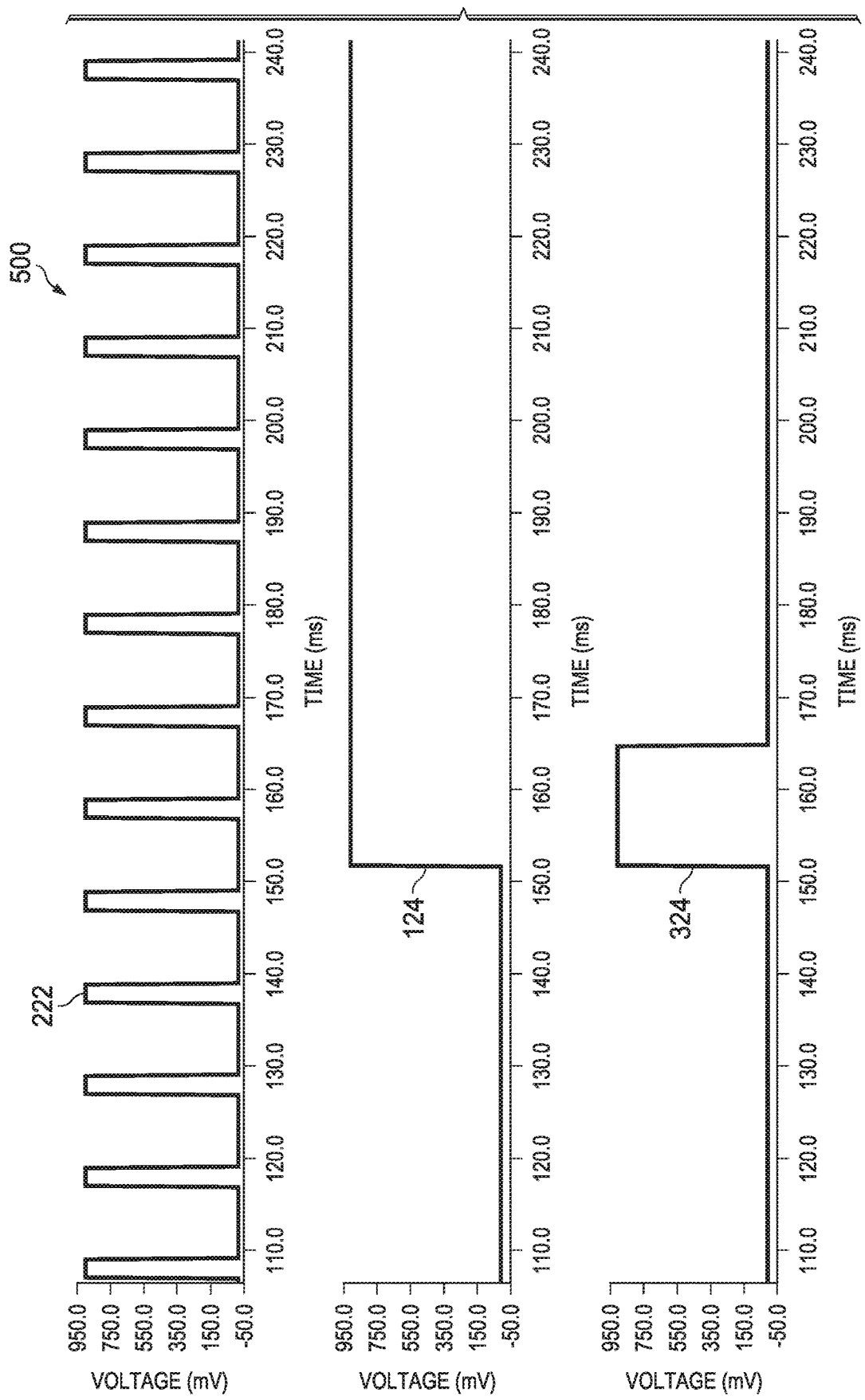
FIG. 5 shows an illustrative voltage versus time graph for an amplified digital signal, a wakeup circuit output signal, and a clock signal in accordance with various examples.

FIG. 5 shows an illustrative voltage versus time graph 500 for amplified digital signal 222, wakeup circuit output signal 124, and clock signal 324 in accordance with various examples. As shown in FIG. 5, the example amplified digital signal 222 includes at least five toggles (transitions from a LOW signal to a HIGH signal) during the clock period of clock signal 324. In other words, example amplified digital signal 222 in FIG. 5 toggles at least five times during the period that clock signal 324 is LOW. If the threshold value for number of toggles of amplified digital signal 222 is three during a clock period, then, as shown in FIG. 5, the digital filter 310 generates a HIGH output signal 124 once the clock signal 324 transitions from a LOW signal to a HIGH signal. In other words, because the number of toggles of amplified digital signal 222 is greater than the threshold value of three during the clock period, the digital filter 310 generates a wakeup signal (e.g., HIGH output signal 124) to power up the main circuit 108. However, if the threshold value for number of toggles of amplified digital signal 222 is six during a clock period, then, the digital filter 310 generates a LOW output signal 124 (not shown in FIG. 5). In such a scenario, the main circuit 108 remains and/or enters the low power mode. As discussed above, other digital filter implementations may generate a wakeup signal.

Figure 6:
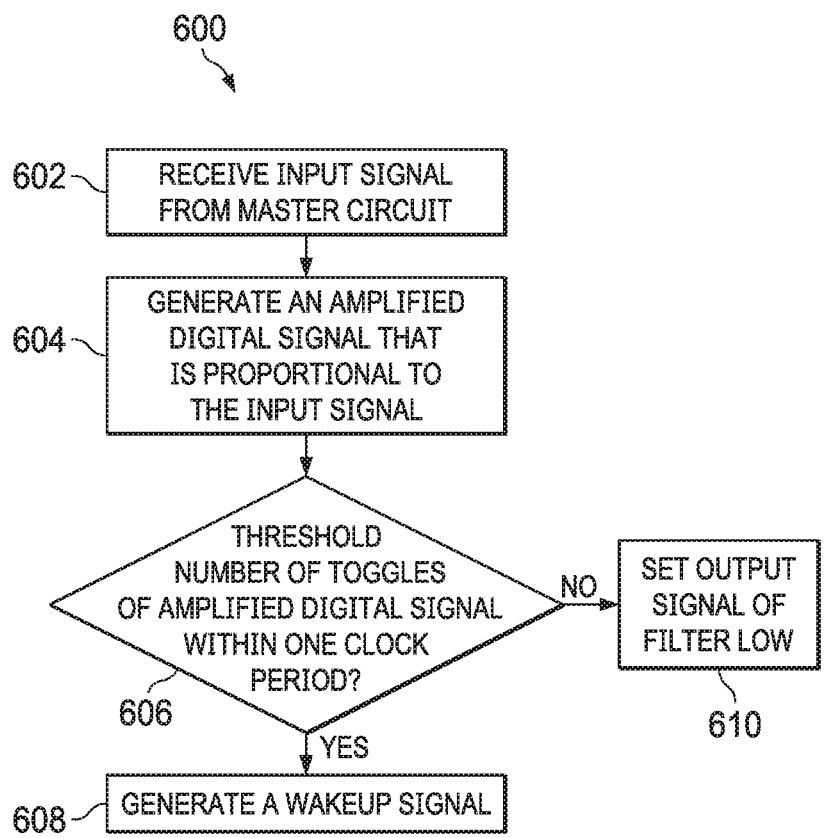
FIG. 6 shows an illustrative flow diagram of a method for generating a wakeup signal in accordance with various examples.

FIG. 6 shows an illustrative flow diagram of a method 600 for generating a wakeup signal in accordance with various examples. Though depicted sequentially as a matter of convenience, at least some of the actions shown can be performed in a different order and/or performed in parallel. Additionally, some examples may perform only some of the actions shown. In some examples, at least some of the operations of the method 600, as well as other operations described herein, are performed by the master circuit 102, the amplification stage circuit 202 (including the coupling capacitor 302, the inverters 306-308 and/or the feedback resistor 304), the filter stage circuit 204 (including the oscillator 312 and/or the digital filter 310), and/or the main circuit 108 and implemented in logic.

The method 600 begins in block 602 with receiving an input signal from a master circuit. For example, the wakeup circuit 106, and in more particularity, the amplification stage circuit 202 can receive the input signal 122 from master circuit 102. In block 604, the method 600 continues with generating an amplified digital signal that is proportional to the input signal. For example, the amplification stage circuit 202 can generate the amplified digital signal 222. The amplified digital signal 222 is, in some examples, an amplified digital version of the analog input signal 122.

The method 600 continues in block 606 with determining whether a threshold number of toggles of the amplified digital signal have been received within one clock period of a clock signal. For example, the digital filter 310 can receive both the amplified digital signal 222 and clock signal 324. The digital filter 310 can also determine if the amplified digital signal toggles (i.e., transitions from a LOW signal to a HIGH signal) more than a threshold number of times during the clock period of the clock signal 324.

If, in block 606, a determination is made that the received amplified digital signal has toggled a threshold number of toggles within on clock period of a clock signal, then the method 600 continues in block 608 with generating a wakeup signal. For example, if the amplified digital signal 222 toggles (transitions from a LOW signal to a HIGH signal) a greater number of times than a threshold number of toggles within one clock period of clock signal 324 (within the time the clock signal 324 remains LOW), then the digital filter 310 generates a HIGH output signal 124 which is a wakeup signal for powering up main circuit 108 from a low power mode.

However, if, in block 606, a determination is made that the received amplified digital signal has not toggled a threshold number of toggles within on clock period of a clock signal, then the method 600 continues in block 610 with setting an output signal of a digital filter to LOW. For example, if the amplified digital signal 222 toggles less times than the threshold number of toggles within one clock period of clock signal 324, then the digital filter 310 generates a LOW output signal 124 which can cause the main circuit 108 to enter into and/or remain in a low power mode.

Figure 7:
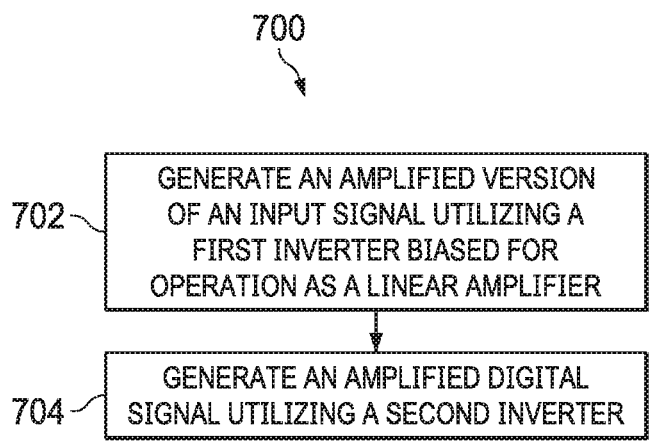
FIG. 7 shows an illustrative flow diagram of a method for generating an amplified digital signal in accordance with various examples.

FIG. 7 shows an illustrative flow diagram of a method 700 for generating an amplified digital signal in accordance with various examples. Though depicted sequentially as a matter of convenience, at least some of the actions shown can be performed in a different order and/or performed in parallel. Additionally, some examples may perform only some of the actions shown. In some examples, at least some of the operations of the method 700, as well as other operations described herein, are performed by the amplification stage circuit 202 (including the coupling capacitor 302, the inverters 306-308 and/or the feedback resistor 304) and implemented in logic.

The method 700 begins in block 702 with generating an amplified version of a received input signal utilizing a first inverter biased for operation as a linear amplifier. For example, the inverter 306 with feedback amplifier 304 can act as a linear amplifier. The inverter 306 can receive the input signal 122, in some examples from coupling capacitor 302, from the master circuit 102 and amplify the input signal 122 to generate the amplified analog signal 322.

In block 704, the method 700 continues with generating the amplified digital signal utilizing a second inverter. For example, the inverter 308 can receive the amplified analog signal 322 and generate the amplified digital signal 222.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A wakeup circuit, comprising:
an amplification stage circuit configured to, in response to receiving an input signal, generate an amplified digital signal that is proportional to the input signal; and
a filter stage circuit coupled to the amplification stage circuit, the filter stage circuit configured to, in response to receiving a threshold number of toggles of the amplified digital signal within a pre-defined time period, generate a wakeup signal as an output signal of the filter stage circuit.

2. The wakeup circuit of claim 1, wherein the amplification stage circuit includes:
a first inverter biased for operation as a linear amplifier, the first inverter configured to receive the input signal and generate an amplified analog version of the input signal; and
a second inverter coupled to the first inverter, the second inverter configured to receive the amplified analog version of the input signal and generate the amplified digital signal.

3. The wakeup circuit of claim 2, wherein the amplification stage circuit further includes a coupling capacitor coupled to the first inverter, the coupling capacitor configured to have a capacitance to tune a response of the first inverter to be centered on a frequency of the input signal.

4. The wakeup circuit of claim 2, wherein the first inverter is configured to have a first switching threshold and the second inverter is configured to have a second switching threshold, the first switching threshold being different than the second switching threshold.

5. The wakeup circuit of claim 4, wherein the second switching threshold is greater than the first switching threshold.

6. The wakeup circuit of claim 1, wherein the filter stage circuit includes:
an oscillator configured to generate a clock signal with a clock period corresponding to the pre-defined time period; and
a digital filter to receive the amplified digital signal and the clock signal and generate the wakeup signal.

7. The wakeup circuit of claim 6, wherein the oscillator is a ring oscillator.

8. The wakeup circuit of claim 6, wherein the digital filter is a synchronous filter.

9. The wakeup circuit of claim 1, wherein the wakeup signal is a HIGH signal.

10. The wakeup circuit of claim 9, wherein the filter stage circuit is further configured, in response to receiving less than the threshold number of toggles of the amplified digital signal within one clock period of a clock signal, to reset the output signal to a LOW signal.

11. The wakeup circuit of claim 1, wherein the filter stage circuit includes:
an oscillator configured to generate a clock signal with a clock period corresponding to the pre-defined time period, and with a clock signal frequency that is less than a frequency of the amplified digital signal; and a digital filter to receive the amplified digital signal and the clock signal and generate the wakeup signal.

12. A low power mode circuit system, comprising:
a master circuit configured to generate an input signal; and
a slave circuit including:
 a wakeup circuit configured to:
  receive the input signal;
  in response to receiving the input signal, generate an amplified digital signal that is proportional to the input signal;
  in response to receiving a threshold number of toggles of the amplified digital signal within a pre-defined time period, generate a wakeup signal; and
 a main circuit configured to, in response to receiving the wakeup signal, power up from a low power mode to a regular operation mode.

13. The low power mode circuit system of claim 12, wherein the wakeup circuit is configured to generate the amplified digital signal utilizing a first inverter biased for operation as a linear amplifier to generate an amplified analog version of the input signal and a second inverter configured to generate the amplified digital signal based on the amplified analog version of the input signal.

14. The low power mode circuit system of claim 13, wherein the wakeup circuit is further configured to tune a response of the first inverter to be centered on a frequency of the input signal.

15. The low power mode circuit system of claim 13, wherein the first inverter is configured to have a first switching threshold and the second inverter is configured to have a second switching threshold, the first switching threshold being less than the second switching threshold.

16. The low power mode circuit system of claim 12, wherein the wakeup circuit is configured to generate the wakeup signal utilizing a digital filter including clock circuitry to generate a clock signal with a clock period corresponding to the pre-defined time period.

17. The low power mode circuit system of claim 16, wherein:
the wakeup circuit is further configured, in response to receiving less than the threshold number of toggles of the amplified digital signal within one clock period of the clock signal, to set an output signal of the digital filter to a LOW signal; and
the wakeup signal is a HIGH signal of the output signal.

18. A method for generating a wakeup signal, comprising:
receiving an input signal indicating that a circuit is to exit a low power mode from a master circuit;
in response to receiving the input signal, generating an amplified digital signal that is proportional to the input signal; and
in response to receiving a threshold number of toggles of the amplified digital signal within a pre-defined time period, generating, by a digital filter, the wakeup signal.

19. The method of claim 18, wherein the generating the amplified digital signal includes:
generating an amplified version of the input signal utilizing a first inverter biased for operation as a linear amplifier; and
generating the amplified digital signal utilizing a second inverter.

20. The method of claim 18, further comprising, in response to receiving less than the threshold number of toggles of the amplified digital signal within the pre-defined time period, setting an output signal of the digital filter to a LOW signal, wherein the wakeup signal is a HIGH signal of the output signal of the digital filter.

* * * * *